United States Patent
Suzuki et al.

(10) Patent No.: US 8,809,970 B2
(45) Date of Patent: Aug. 19, 2014

(54) SEMICONDUCTOR DEVICE AND METHOD FOR MANUFACTURING THE SAME

(75) Inventors: Masamichi Suzuki, Tokyo (JP); Tatsuo Shimizu, Tokyo (JP); Atsuhiro Kinoshita, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/554,204

(22) Filed: Jul. 20, 2012

(65) Prior Publication Data
US 2012/0326244 A1 Dec. 27, 2012

Related U.S. Application Data

(63) Continuation of application No. PCT/JP2010/000344, filed on Jan. 22, 2010.

(51) Int. Cl.
H01L 29/78 (2006.01)
H01L 21/02 (2006.01)
H01L 21/28 (2006.01)
H01L 29/51 (2006.01)
H01L 29/788 (2006.01)
H01L 49/02 (2006.01)

(52) U.S. Cl.
CPC ........ H01L 29/785 (2013.01); H01L 21/02192 (2013.01); H01L 29/7833 (2013.01); H01L 21/28194 (2013.01); H01L 29/7881 (2013.01); H01L 29/517 (2013.01); H01L 21/28282 (2013.01); H01L 21/02194 (2013.01); H01L 21/02178 (2013.01); H01L 28/40 (2013.01); H01L 21/02266 (2013.01); H01L 21/28273 (2013.01)
USPC ........................................ 257/410

(58) Field of Classification Search
USPC ........................ 257/410, 288, 213, E29.255
See application file for complete search history.

(56) References Cited

U.S. PATENT DOCUMENTS 6,657,267 B1 * 12/2003 Xiang et al. ................ 257/410
7,282,773 B2 10/2007 Li et al.
(Continued)

FOREIGN PATENT DOCUMENTS

JP 2002-280461 9/2002
JP 2005-534163 11/2005
(Continued)

OTHER PUBLICATIONS

D. Triyoso et al., "Evaluation of Lanthanum Based Gate Dielectrics Deposited by Atomic Layer Deposition," J. Vac. Sci. Technol., vol. B 23, No. 1, pp. 288-297 (Jan./Feb. 2005).

(Continued)

Primary Examiner — Michele Fan
(74) Attorney, Agent, or Firm — Finnegan, Henderson, Farabow, Garrett & Dunner, L.L.P.

(57) ABSTRACT

A semiconductor device includes a semiconductor substrate, a source region, a drain region, an insulating film and a gate electrode. The source region is formed in the semiconductor substrate. The drain region is formed in the semiconductor substrate and being separate from the source region. The insulating film is formed between the source region and the drain region and on or above the semiconductor substrate. The insulating film includes lanthanum aluminate containing at least one element selected from Si, Ge, Mg, Ca, Sr, Ba and N. The lanthanum aluminate contains at least one element selected from Ti, Hf and Zr. The gate electrode is formed on the insulating film.

12 Claims, 25 Drawing Sheets

(56) References Cited

U.S. PATENT DOCUMENTS

| | | | |
|---|---|---|---|
| 2002/0135030 A1* | 9/2002 | Horikawa | 257/405 |
| 2002/0137250 A1* | 9/2002 | Nguyen et al. | 438/53 |
| 2002/0137317 A1 | 9/2002 | Kaushik et al. | |
| 2005/0260347 A1* | 11/2005 | Narwankar et al. | 427/248.1 |
| 2005/0260357 A1* | 11/2005 | Olsen et al. | 427/569 |
| 2006/0019033 A1* | 1/2006 | Muthukrishnan et al. | 427/248.1 |
| 2006/0163676 A1* | 7/2006 | Shimizu et al. | 257/410 |
| 2007/0120164 A1 | 5/2007 | Fukui et al. | |
| 2008/0121979 A1* | 5/2008 | Nishikawa et al. | 257/321 |
| 2008/0199975 A1* | 8/2008 | Park et al. | 438/3 |
| 2008/0237699 A1 | 10/2008 | Shimizu et al. | |
| 2009/0181505 A1* | 7/2009 | Ando et al. | 438/216 |
| 2009/0181531 A1* | 7/2009 | Chae et al. | 438/591 |
| 2009/0194797 A1* | 8/2009 | Shimizu et al. | 257/288 |
| 2009/0242963 A1* | 10/2009 | Shingu et al. | 257/324 |
| 2009/0242970 A1 | 10/2009 | Shimizu et al. | |
| 2009/0267130 A1* | 10/2009 | Zhu | 257/316 |
| 2010/0048032 A1* | 2/2010 | Sangam et al. | 438/785 |
| 2010/0155889 A1* | 6/2010 | Cho et al. | 257/532 |
| 2010/0244157 A1 | 9/2010 | Hirano et al. | |

FOREIGN PATENT DOCUMENTS

| | | |
|---|---|---|
| JP | 2006-135084 | 5/2006 |
| JP | 2006-210518 | 8/2006 |
| JP | 2007-142385 | 6/2007 |
| JP | 2009-182207 | 8/2009 |
| JP | 2009-239080 | 10/2009 |
| JP | 2009-239216 | 10/2009 |

OTHER PUBLICATIONS

English-language International Search Report from the Japanese Patent Office in International Application No. PCT/JP2010/000344; Mailing Date: May 18, 2010.

Notification of Reasons for Refusal issued by the Japanese Patent Office on Oct. 7, 2013, for Japanese Patent Application No. 2011-550716, and partial English translation thereof.

* cited by examiner

140 ⋯ BURIED INSULATING LAYER

SEMICONDUCTOR DEVICE AND METHOD FOR MANUFACTURING THE SAME

CROSS-REFERENCE TO RELATED APPLICATION(S)

This is a Continuation Application of PCT Application No. PCT/JP2010/000344, filed on Jan. 22, 2010, which was published under PCT Article 21(2) in Japanese, the entire contents of which are incorporated herein by reference.

BACKGROUND

Technical Field

Embodiments of the invention relate mainly to a semiconductor device and a method for manufacturing the same.

DETAILED DESCRIPTION

Figure 1:
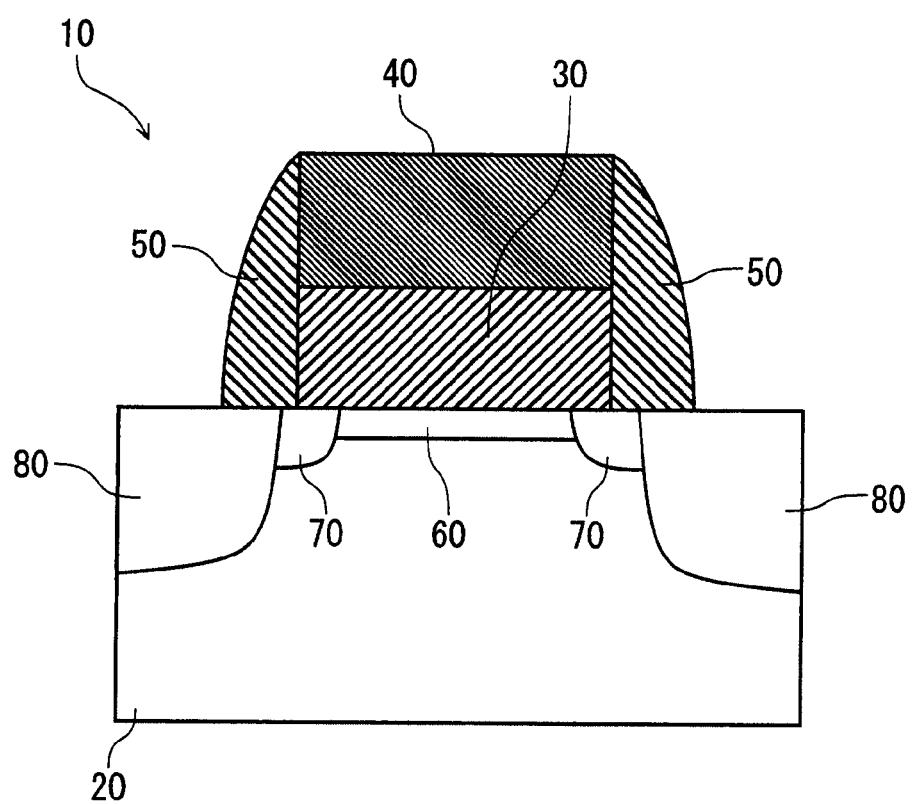
FIG. 1 is an exemplary view showing the configuration of a semiconductor device according to a first embodiment.

Various embodiments will be described below with reference to the accompanying drawings. In the drawings which will be described below, parts having identical reference numeral represent similar parts, and duplicate description thereon will be omitted.

According to one embodiment, a semiconductor device includes a semiconductor substrate, a source region, a drain region, an insulating film and a gate electrode. The source region is formed in the semiconductor substrate. The drain region is formed in the semiconductor substrate with being separate from the source region. The insulating film is formed between the source region and the drain region and on or above the semiconductor substrate. The insulating film includes lanthanum aluminate containing at least one element selected from Si, Ge, Mg, Ca, Sr, Ba and N. The lanthanum aluminate contains at least one element selected from Ti, Hf and Zr. The gate electrode is formed on the insulating film.

First Embodiment

A semiconductor device 10 according to a first embodiment of the invention will be described. It is assumed that the semiconductor device 10 according to the first embodiment has a MISFET (Metal Insulator Semiconductor Field Effect Transistor) structure.

FIG. 1 is a view showing the configuration of the semiconductor device 10 according to the first embodiment.

In the semiconductor device 10 according to the first embodiment, a gate electrode 40 is formed on an insulating film 30 formed on a semiconductor substrate 20, and gate side walls 50 are formed on side walls of the insulating film 30 and the gate electrode 40. A channel region 60 is formed under the insulating film 30, and lightly doped shallow diffusion regions 70 are formed so as to be opposed to each other across the channel region 60. Also, source-drain regions 80 are formed so as to be opposed to each other outside the lightly doped shallow diffusion regions 70. Device separation layers (not sown) for electrically isolating the MISFET from adjacent devices are formed on both sides of the MISFET.

Single-crystal Si is generally used for the semiconductor substrate 20. Other examples of the semiconductor substrate 20 may include polycrystal Si, amorphous Si, SiGe, single-layer graphene, multilayer graphene, Ge, SOI (Silicon On Insulator), etc.

In addition thereto, a compound semiconductor, an organic polymer or the like may be also used as the semiconductor substrate 20. For example, SiC, GaAs, InP, InAs, GaInAs, GaN, GaInN, or the like may be used as the compound semiconductor. For example, pentacene or the like may be used as the organic polymer.

The insulating film 30 has lanthanum aluminate containing at least one element selected from Si, Ge, Mg, Ca, Sr, Ba and N and at least one element selected from Ti, Zr and Hf. The lanthanum aluminate in the first embodiment has a perovskite-type structure with a composition of LaAlO$_3$.

Also, it is preferable that the lanthanum aluminate has a composition of La$_{2x}$Al$_{2(1-x)}$O$_y$ (x is not lower than 0.33 and not higher than 0.67, and y is not lower than 2.85 and not higher than 3.15).

The reason why x is not lower than 0.33 and not higher than 0.67 is because there is a possibility that a drive current of the semiconductor device 10 may be lowered for the following reason if the insulating film 30 with a value out of this range is used.

If x is a value lower than 0.33, there is a possibility that existence of Al$_2$O$_3$ generated in addition to LaAlO$_3$ of the perovskite structure cannot be bypassed. That is, a characteristic as Al$_2$O$_3$ may be elicited. Al$_2$O$_3$ has a low permittivity. Therefore, if the lanthanum aluminate in which x is a value lower than 0.33 is used for the insulating film 30, there is a possibility that a permittivity of the insulating film 30 may be lowered. Thus, if the insulating film 30 in which x is a value lower than 0.33 is used in the semiconductor device 10, there is a possibility that the drive current may be lowered.

On the contrary, if x is a value higher than 0.67, the existence of La$_2$O$_3$ generated in addition to LaAlO$_3$ of the perovskite structure cannot be bypassed. That is, a characteristic as La$_2$O$_3$ may be elicited. Oxides of La are highly hygroscopic. Therefore, if the lanthanum aluminate in which x is a value higher than 0.67 is used for the insulating film 30, there is a possibility that the insulating film 30 may expand. As a result, an amount of charges accumulated in the insulating film 30 is reduced so that there is a possibility that the drive current of the semiconductor device 10 may be lowered.

On the other hand, y which is set to be not lower than 2.85 and not higher than 3.15 is a result in consideration of the case where O may be eliminated from or mixed into the insulating film 30 in a manufacturing process.

Especially it is preferable that the lanthanum aluminate is LaAlO$_3$.

Also, an oxide layer not thinner than 0.5 nm and not thicker than 1 nm may be inserted into an interface between the insulating film 30 and the semiconductor substrate 20. For example, SiO$_2$, La$_2$O$_3$ or Al$_2$O$_3$ may be used for the oxide layer. Incidentally, Si and O composing SiO$_2$ may be diffused in the insulating film 30. As for La$_2$O$_3$ and Al$_2$O$_3$, La, Al and O may be also diffused in the insulating film 30.

As described above, when an SiO$_2$ film is formed directly on the insulating film 30, the SiO$_2$ film may be set to be not thicker than 0.5 nm.

The A-site of the lanthanum aluminate (corresponding to the La-site of LaAlO$_3$) may be substituted with Si, Ge, Mg, Ca, Sr, or Ba. The O-site of the lanthanum aluminate (corresponding to the O-site of LaAlO$_3$) may be substituted with N. The B-site of the lanthanum aluminate (corresponding to the Al-site of LaAlO$_3$) may be substituted with Ti, Zr or Hf.

When at least one element selected from Si, Ge, Mg, Ca, Sr, Ba and N and at least one element selected from Ti, Zr and Hf are added to the lanthanum aluminate, the energy state of the insulating film 30 can be stabilized.

Thus, it is possible to suppress generation of an oxygen defect in the insulating film 30 and increase of a leakage current, and it is further possible to improve the mobility of carriers.

Stabilizing the energy state of the insulating film 30 will be described below.

First, description will be made on the electron state of each element in the insulating film 30 when Si, Ge, Mg, Ca, Sr, Ba, N, Ti, Zr and Hf are added into the insulating film 30.

The electron state, the energy state and the atomic configuration of the insulating film 30 can be obtained by first-principle calculation with ultra-soft pseudo-potential. Here, local density approximation is used. In the first principle calculation, potentials of La, Al, O, Hf, Zr, Ti, Si, Ge, N, Ba, Sr, Ca, Mg, Y, Sc, and lanthanum series represented by Ln are used.

In performing the first principle calculation, a unit cell of 2a×2a×2a is used for a lattice constant a of lanthanum aluminate having a perovskite type structure. Eight k-points are used for calculating the Brillouin zone (BZ) of the unit cell of 2a×2a×2a. Energy cutoff on this occasion is 30.25 Ryd (1 Ryd=13.6058 eV).

Figure 2A:
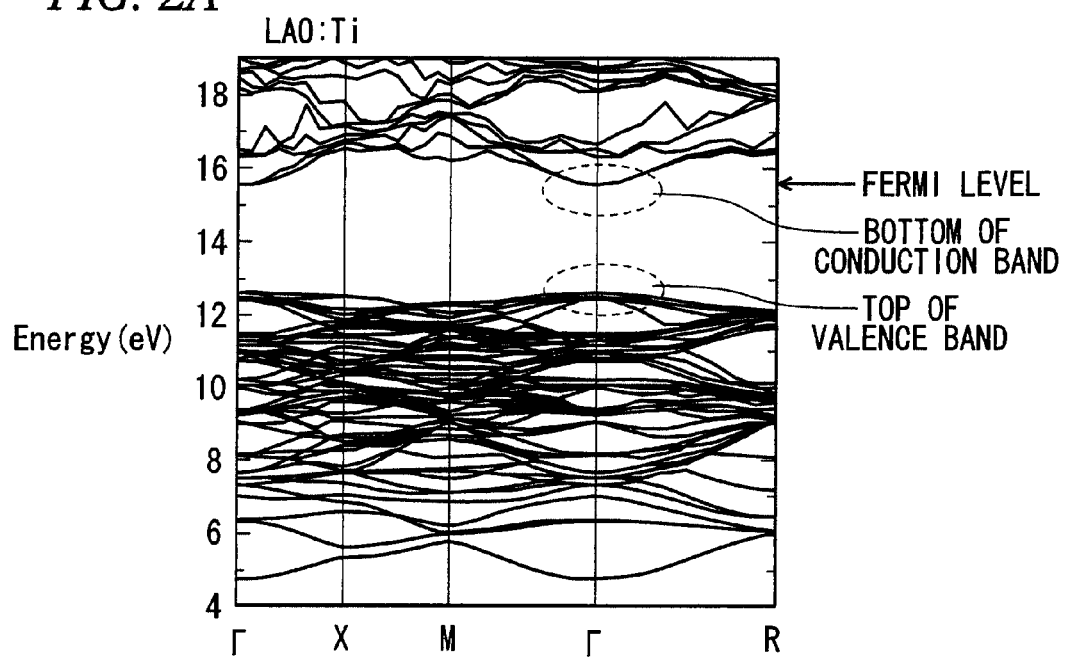
FIG. 2A is an exemplary energy band diagram showing a case where Ti has been added to lanthanum aluminate.

An energy band diagram as shown in FIG. 2A is the case in which Ti has been added to the insulating film 30 containing lanthanum aluminate. The ordinate designates the energy, and the abscissa designates the k-points of the Brillouin zone.

Figure 2B:
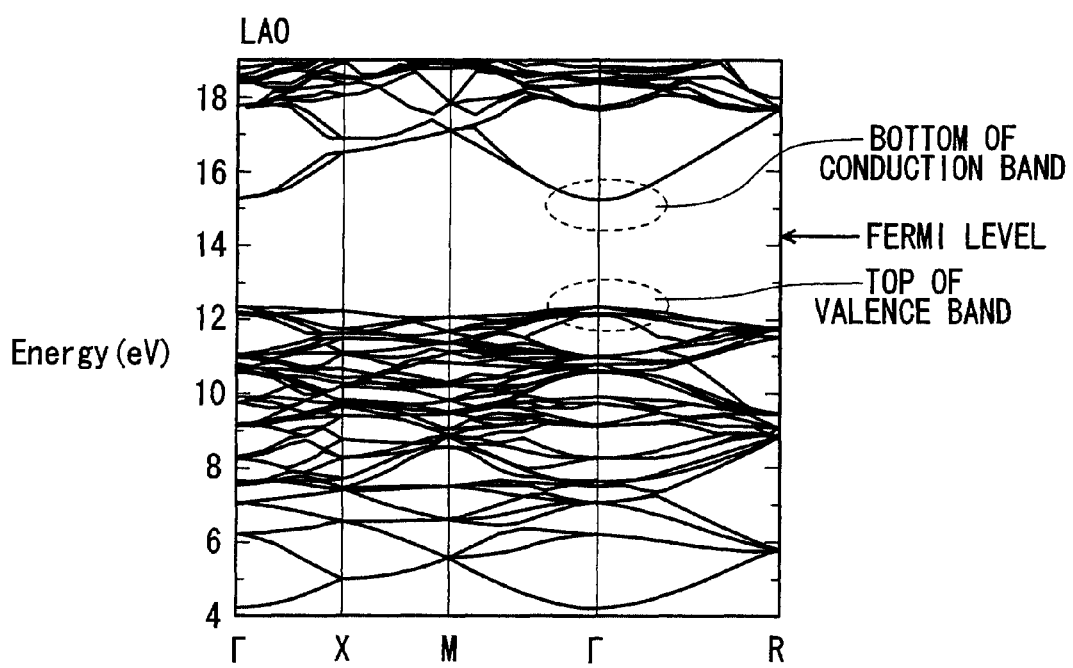
FIG. 2B is an exemplary energy band diagram of lanthanum aluminate.

On the other hand, FIG. 2B shows an energy band diagram of lanthanum aluminate to which nothing has been added.

When the band gap in the energy band diagram shown in FIG. 2A in which Ti has been added to lanthanum aluminate is compared with the band gap in the energy band diagram of lanthanum aluminate to which nothing has been added, no change can be observed in the shape of the bottom of the conduction band. It can be therefore seen that electrons are abundant in the conduction band.

That is, Ti indeed enters the Al site of the lanthanum aluminate, but electrons exist in the bottom of the conduction band because Ti has more electrons by one. In this case, the energy of the lanthanum aluminate can be stabilized over the whole system thereof when acceptors for accepting the electrons are introduced. That is, since Ti serves as donor, when excess electrons generated by addition of Ti to the lanthanum aluminate are transferred to the acceptors, gain of energy corresponding to the band gap of the lanthanum aluminate added with Ti as shown in FIG. 2A can be expected. On this occasion, Fermi energy is located near the bottom of the conduction band, and one electron is redundant (per Ti atom). Incidentally, Ti contributes to the insulating film 30 as positive tetrad with respect to the lanthanum aluminate.

Figure 2C:
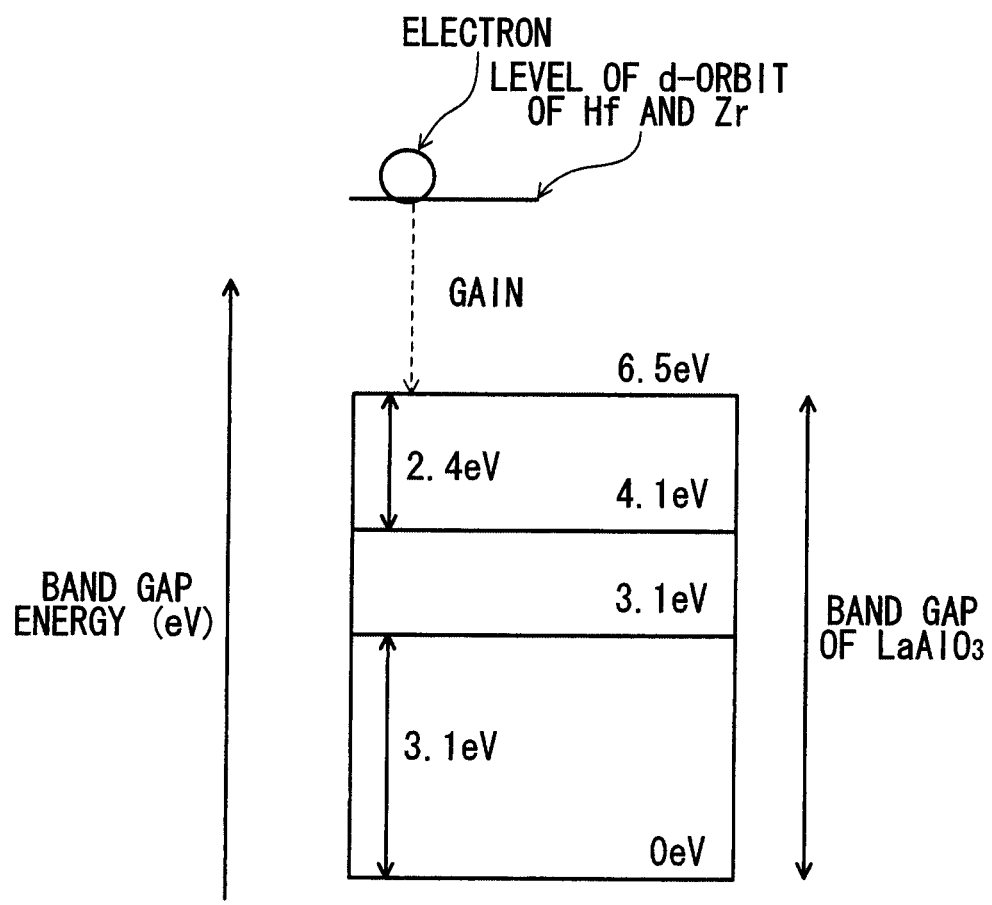
FIG. 2C is an exemplary view for explaining the band diagram of lanthanum aluminate.

Zr or Hf has a Fermi level in its d-orbit in the same manner as Ti. Therefore, a similar result can be obtained by addition of Zr or Hf. As shown in FIG. 2C, Zr or Hf has a 4d-orbit or a 5d-orbit higher in level than the 3d-orbit of Ti. Thus, Zr or Hf can make the insulating film 30 more stable. That is, electrons in higher energy positions fall down to the bottom of the conduction band of the lanthanum aluminate so that energy gain can be expected.

As described above, when Ti, Zr or Hf is added to the insulating film 30 containing lanthanum aluminate, the addition of Ti, Zr or Hf generates excess electrons. When acceptors are generated by some means, the electrons can be supplied to the acceptors to stabilize the energy state of the lanthanum aluminate.

In order to generate the acceptors, at least one element selected from Si, Ge, Mg, Ca, Sr, Ba and N is added to the lanthanum aluminate. Those elements have a common function of accepting electrons, but have different ways of contribution because Si, Ge, Mg, Ca, Sr and Ba enter the La-site of the lanthanum aluminate while N enters the O-site of the lanthanum aluminate.

First, description will be made on the case where N has been added to the lanthanum aluminate.

When N is added to the lanthanum aluminate, N enters the O-site of the lanthanum aluminate. Since the number of electrons in N is smaller than in O by one, a hole is generated in the top of the valence band. That is, N functions as acceptor for accepting an electron. When the same amount of N as that of Ti, Zr or Hf serving as donor is added to cancel negative charges of Ti, Zr or Hf, N can accept excess electrons generated by addition of Ti. Thus, the energy state of the insulating film 30 can be stabilized. Incidentally, N contributes to the insulating film 30 as negative triad in this case.

Next, description will be made on the case where at least one element selected from Si, Ge, Mg, Ca, Sr and Ba has been added to the lanthanum aluminate. Here, the case where Si has been added will be described by way of example.

Figure 3:
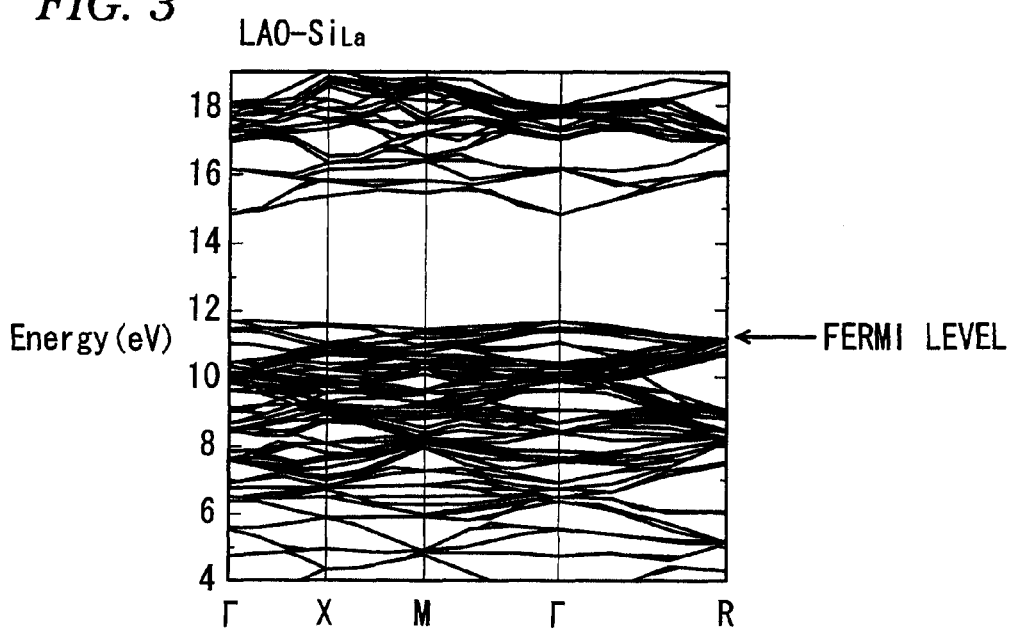
FIG. 3 is an exemplary energy band diagram in the case where Si is added to lanthanum aluminate.
Figure 3:
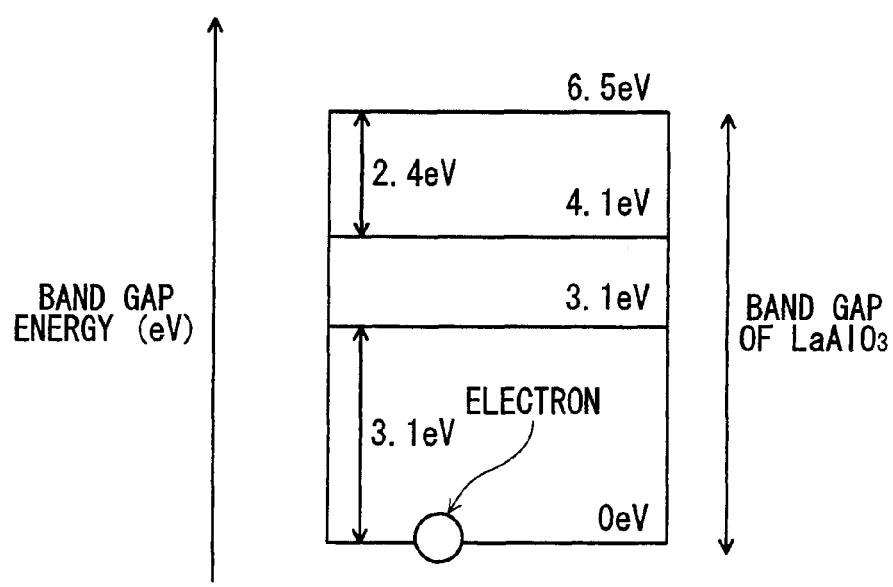

An upper part of FIG. 3 shows an energy band diagram in a state in which Si has been added to the lanthanum aluminate, and a lower part of FIG. 3 shows a schematic view of the energy band diagram in the state in which Si has been added to the lanthanum aluminate. In the upper part of FIG. 3, the ordinate designates energy, and the abscissa designates k-points of the Brillouin zone.

When the band gap in the energy band diagram shown in the upper part of FIG. 3 in the state in which Si has been added to the lanthanum aluminate is compared with that in the energy band diagram shown in FIG. 2B in which nothing has been added to the lanthanum aluminate, no change can be observed in the top of the valence band. It can be therefore seen that electrons are not sufficient in the valence band.

That is, Si enters the La-site of the lanthanum aluminate, but a hole is generated in the top of the valence band because one electron is short. That is, Si serves as acceptor for accepting an electron. When Ti, Hf or Zr is added to the lanthanum aluminate, these elements serve as donors to contribute to the energy state of the lanthanum aluminate. Thus, Si can serve as acceptor to compensate the donor state so that the energy state of the insulating film 30 can be stabilized.

Also, when Si is added to the lanthanum aluminate, Si serves as silicate having a lower permittivity than that of the lanthanum aluminate. The silicate means that $SiO_2$ is mixed with the lanthanum aluminate. As described above, however, Si enters the La-site of the lanthanum aluminate and serves as positive dyad when there is a donor in the energy state of the lanthanum aluminate due to the addition of Ti, Hf or Zr to the lanthanum aluminate. This is because the lanthanum aluminate has the perovskite-type structure, and to keep the state of the perovskite-type structure is more stable than to form silicate. Also, in this case, Si is not mixed with the lanthanum aluminate but has a structure in which Si has been in the La-site of the lanthanum aluminate.

Also, Ge and Si are homologous elements. In the same manner as Si, therefore, Ge has an electron state as positive dyad. Also, these elements Mg, Ca, Sr and Ba are homologous elements and are elements having an electron state as positive dyad. Therefore, these elements enter the La-site of the lanthanum aluminate in the same manner as Si.

The above description can be summarized as follows. When Si, Ge, Mg, Ca, Sr and Ba each having an electron state as positive dyad are added to lanthanum aluminate, La in the lanthanum aluminate is substituted with these elements. For example, it is assumed that La is substituted with Si among these elements. Since Si has an electron state as positive dyad while La has an electron state as positive triad, the lanthanum aluminate as a whole accepts an electron and has an electron state as negative monad.

When Ti, Hf and Zr each having an electron state as positive tetrad are added to lanthanum aluminate, Al in the lanthanum aluminate is substituted with these elements. For example, it is assumed that Al is substituted with Ti among these elements. Since Ti has an electron state as positive tetrad while Al has an electron state as positive triad, the lanthanum aluminate as a whole releases one electron and has an electron state as positive monad.

When N having an electron state as negative triad is added to lanthanum aluminate, O in the lanthanum aluminate is substituted with N. In this case, N has an electron state as negative triad while O has an electron state as negative dyad. Therefore, the lanthanum aluminate as a whole accepts an electron and has an electron state as negative monad.

Thus, the energy state of lanthanum aluminate can be stabilized when the amount of charges is balanced between the result from the fact that Ti, Hf and Zr supplying electrons to the lanthanum aluminate are added to the lanthanum aluminate and the result from the fact that Si, Ge, Mg, Ca, Sr, Ba and N supplying positive holes to the lanthanum aluminate are added to the lanthanum aluminate so as to cancel the states of charges.

Here, when an element M (M is any one of Si, Ge, Mg, Ca, Sr, Ba, N, Ti, Zr and Hf) is added to the insulating film 30, [M] is defined as follows:

[M]=(the number of atoms of the element M)×(an absolute value of the electron state of the insulating film 30 after the element M is added)　　(Expression 1)

In the first embodiment, the electron state of the insulating film 30 to which the element M has been added is positive or negative monadic. Therefore, the absolute value of the electron state is 1. That is, it means one electron is excessive in each donor case while one electron is accepted by each acceptor case.

Also, the number of atoms of the element M shown in Expression 1 may be regarded as the number of atoms of the element M in the insulating film 30. In the first embodiment, however, it is assumed that the number is expressed in atomic percentage.

From Expression 1, when all the elements Si, Ge, Mg, Ca, Sr, Ba, N, Ti, Zr and Hf are added into the insulating film 30, it can be considered that a relationship of Expression 2 is established.

[Ti]+[Hf]+[Zr]=[Si]+[Ge]+[Mg]+[Ca]+[Sr]+[Ba]+[N]　(Expression 2)

In Expression 2, the left-hand side designates the total number of atoms of elements serving as donors, and the right-hand side designates the number total of atoms of elements serving as acceptors.

The aforementioned description has been made on the assumption that one of Ti, Hf and Zr and one of Si, Ge, Mg, Ca, Sr, Ba and N are added to the insulating film 30 containing lanthanum aluminate.

However, it is not necessary to add only one element serving as acceptor for accepting an electron and only one element serving as donor for supplying the electron. Electrons corresponding to the number of atoms of the elements serving as donors can be transferred from the conduction band to the valence band to stabilize the energy state of the insulating film 30 so long as the number of atoms of elements serving as acceptors coincides with the number of atoms of elements serving as donors.

Also, it is preferable that the number of donors coincides with the number of acceptors. However, if a difference between the number of atoms of Ti, Hf and Zr serving as donors and the number of atoms of Si, Ge, Mg, Ca, Sr, Ba and N serving as acceptors is not higher than 0.1 at %, the coincidence in the amount of charges in the insulating film 30, that is, the insulation state can be kept to thereby stabilize the energy state of the insulating film 30.

For example, this can be explained as follows.

In a 4×4×4 unit cell of the lanthanum aluminate contained in the insulating film 30, there are 4×4×4×5=320 atoms. If, of these atoms, a difference between the number of elements serving as donors and the number of elements serving as acceptors is about 1 atom, electric insulation can be kept. That is, if a difference between the additive amount of donors and the additive amount of acceptors is not higher than 0.32 at %, the electric insulation can be kept. It is more preferable that the difference is not higher than 0.1 at %. This is because the difference is an amount close to the amount of impurities contained in the original semiconductor film, and the difference can be equated with the impurities.

Thus, the states of the donors and the acceptors can be compensated with each other so that oxygen defects generated by the addition of elements can be suppressed. It is therefore possible to suppress deterioration in mobility of carriers and further to suppress increase of leakage current.

Also, due to addition of an element selected from Ti, Hf and Zr, the natural vibration mode of the insulating film 30 is loosened so that the relative permittivity of the insulating film 30 can be made higher than the original permittivity of the lanthanum aluminate. Particularly, when N is added, a nitrogen-metal bond weaker than an oxygen-metal bond is introduced to further loose the vibration mode. Thus, the permittivity can be made further higher.

A nitride alloy containing at least two selected from TiN, HfN and ZrN or Ti, Hf and Zr can be used for the gate electrode 40.

Also, the semiconductor device according to the first embodiment may be formed as an N-MISFET or a P-MISFET, or may be formed as a CMISFET (Complementary Metal Insulator Semiconductor Field Effect Transistor) including an N-MISFET and a P-MISFET.

Next, description will be made on a method for manufacturing the semiconductor device 10 according to the first embodiment. Here, a method for manufacturing a CMISFET having N-type and P-type semiconductor devices 10 will be described by way of example. A deposition technique such as a CVD (Chemical Vapour Deposition) Method, an MBE (Molecular Beam Epitaxy) method, a sputtering method, a laser ablation method or the like may be used appropriately for manufacturing the semiconductor device 10.

FIGS. 4 to 9 and FIGS. 10A-10D are views showing the method for manufacturing the semiconductor device 10 according to the first embodiment.

Figure 4:
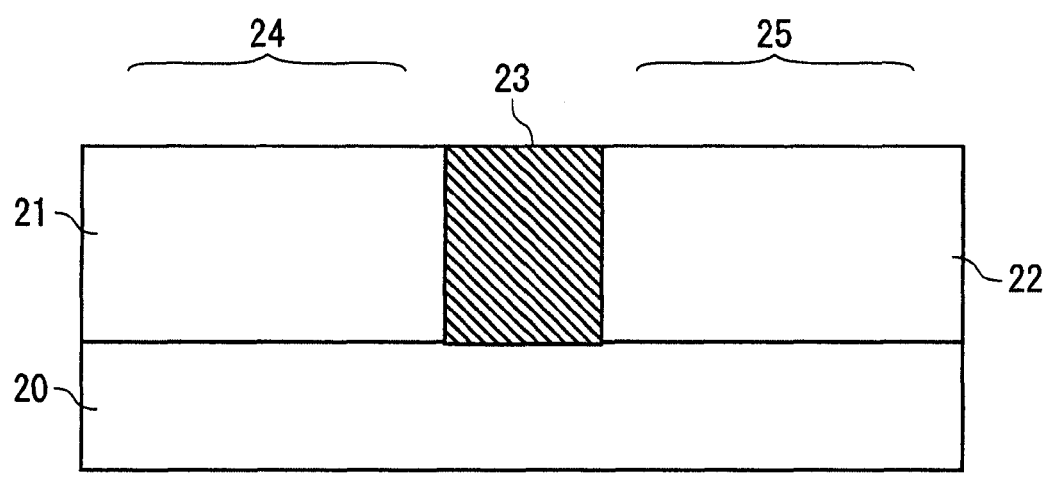
FIG. 4 is an exemplary diagram showing a process for manufacturing the semiconductor device according to the first embodiment.

In FIG. 4, an ion injection method or the like is used for forming a p-type semiconductor layer 21 and an n-type semiconductor layer 22 on a semiconductor substrate 20 so as to form an n-type semiconductor region 24 and a p-type semiconductor region 25. Then, a device separation layer 23 containing silicon oxide is formed in a boundary surface between the p-type semiconductor layer 21 and the n-type semiconductor layer 22.

Figure 5:
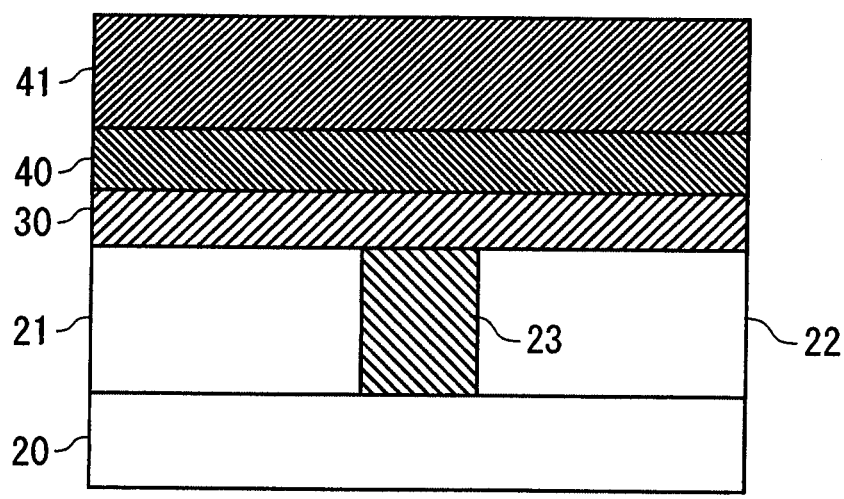
FIG. 5 is an exemplary diagram showing the process for manufacturing the semiconductor device according to the first embodiment.

Next, as shown in FIG. 5, an insulating film 30 containing lanthanum aluminate is formed to be about 3 nm thick on the p-type semiconductor layer 21, the device separation layer 23 and the n-type semiconductor layer 22.

At this time, $La_2O_3$ may be formed to be about 0.5 nm thick between the insulating film 30 and the p-type semiconductor layer 21. $Al_2O_3$ may be formed to be about 0.5 nm thick between the insulating film 30 and the n-type semiconductor layer 22. Thereby, the threshold voltages of the N-MISFET and the P-MISFET can be adjusted to be decreased individually. The threshold voltages may be adjusted not by $La_2O_3$ or $Al_2O_3$ but, for example, by ion injection of, for example, La or Al with energy large enough to bring La or Al into contact with the insulating layer 30 in the p-type semiconductor layer region or the n-type semiconductor layer region.

Next, a gate electrode 40 containing TiN is formed to be 7 nm thick on the insulating film 30.

Next, a polycrystal Si layer 41 is formed to be 50 nm thick on the gate electrode 40.

Figure 6:
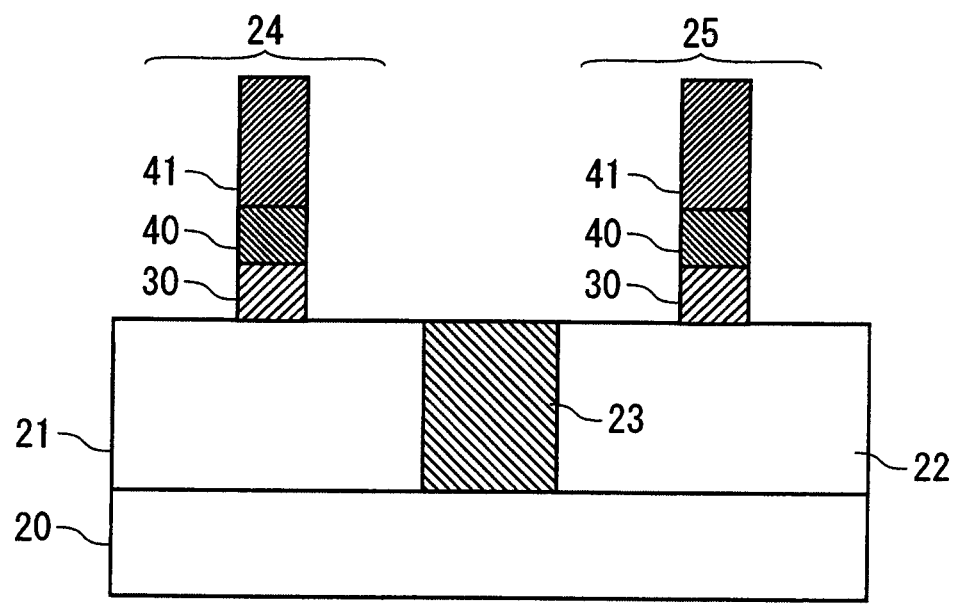
FIG. 6 is an exemplary diagram showing the process for manufacturing the semiconductor device according to the first embodiment.

Next, as shown in FIG. 6, the polycrystal Si layer 41, the gate electrode 40 and the insulating layer 30 are etched by etching technology such as RIE (Reactive Ion Etching) so as to expose the surface of the device separation layer 23, thereby the polycrystal Si layer 41, the gate electrode 40 and the insulating layer 30 are processed.

Figure 7:
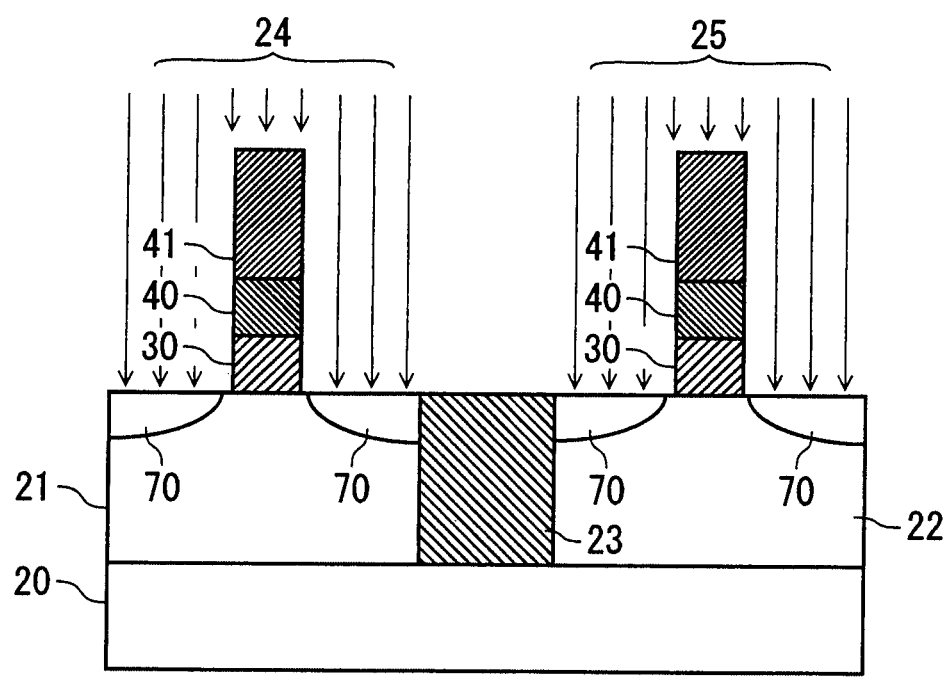
FIG. 7 is an exemplary diagram showing the process for manufacturing the semiconductor device according to the first embodiment.

Next, as shown in FIG. 7, p-type impurities and n-type impurities are ion-injected into the n-type semiconductor region 24 and the p-type semiconductor region 25 using the polycrystal Si layer 41 as a mask, so as to form lightly doped shallow diffusion regions 70, respectively. When impurities are ion-injected into either the n-type semiconductor region 24 or the p-type semiconductor region 25, a mask using a resist is applied to the region where impurities are not ion-injected.

Figure 8:
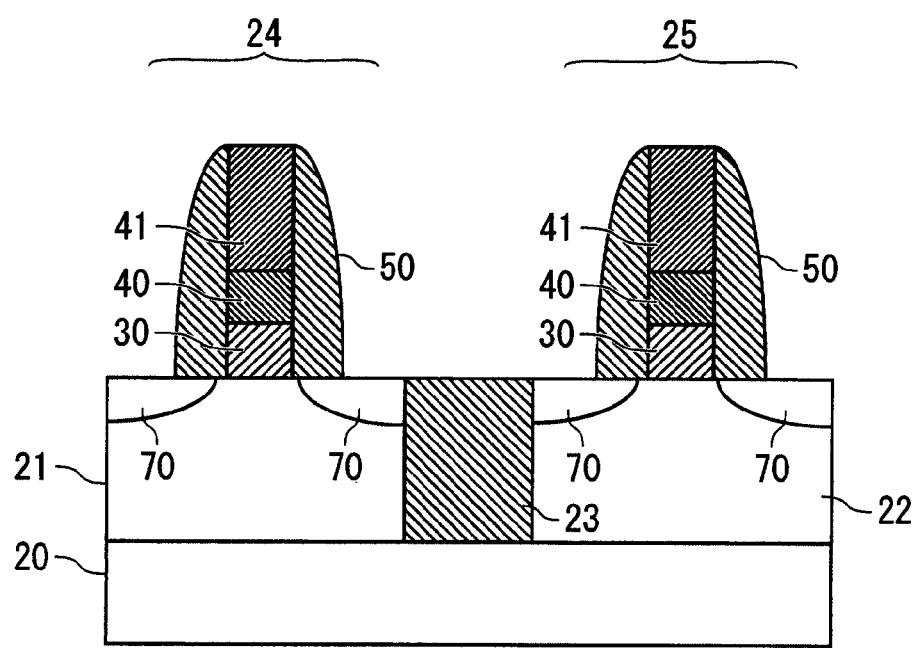
FIG. 8 is an exemplary diagram showing the process for manufacturing the semiconductor device according to the first embodiment.

Next, as shown in FIG. 8, SiN is deposited on the whole surface, and etched using RIE to form gate side walls 50.

Figure 9:
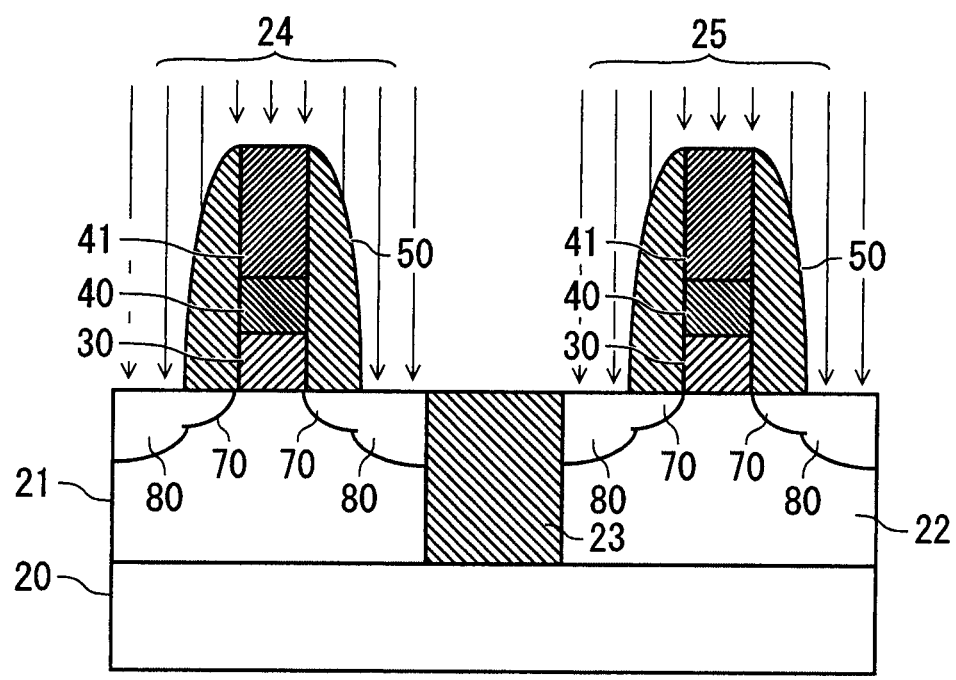
FIG. 9 is an exemplary diagram showing the process for manufacturing the semiconductor device according to the first embodiment.

Next, as shown in FIG. 9, n-type impurities and p-type impurities are ion-injected into deep regions of the n-type semiconductor region 24 and the p-type semiconductor region 25 using the polycrystal Si layer 41 and the gate side walls 50 as masks, so as to form source-drain regions 80.

Then, heat treatment at 1,040° C. is performed in a nitrogen atmosphere. Thereby, Ti, N and Si are introduced into the lanthanum aluminate contained in the insulating film 30. At this time, the relationship in the total amount of additives [Ti]=[N]+[Si] is kept in the insulating film 30. This is because an electrically insulation state is the most stable in the insulating film 30 even if the amounts of the added Ti and N are not controlled discretionarily. Due to such sufficient heating, the added elements are sufficiently diffused into the insulating film so that the most stable donor/acceptor pair can be formed. Here, the heat treatment at 1,040° C. is performed, but any temperature may be used so long as the temperature is not lower than 965° C. as shown in the following examples. On the other hand, the upper limit of the heat treatment temperature is lower than 1,410° C. in consideration of the melting point 1,410° C. of silicon composing the polycrystal Si layer 41. It is, therefore, preferable that the heat treatment is performed in a range of temperature not lower than 965° C. but lower than 1,410° C. Although the upper limit of the heat treatment temperature is theoretically lower than 1,410° C., the heat treatment is preferably performed at a temperature not lower than 965° C. and not higher than 1,040° C. in consideration of an actual manufacturing process.

Also, elimination of nitrogen from the insulating film 30 can be suppressed by the heat treatment performed in the nitrogen atmosphere.

Also, due to the heat treatment, the lightly doped shallow diffusion regions 70, the source-drain regions 80 and the polycrystal Si layer 41 are electrically activated.

In the case where Ge is added into the insulating film 30, a Ge substrate or a SiGe substrate may be used as the semiconductor substrate 20. Thereby, Ge can be added into the insulating film 30.

In the case where Hf or Zr is added into the insulating film 30, HfN or ZrN may be used for the gate electrode 40.

Thereby, Hf or Zr can be added into the insulating film 30. To supply Hf and Zr concurrently, a nitride alloy containing Hf and Zr may be used, or a co-sputtering method for sputtering with plural targets may be used.

In the case where Mg, Ca, Sr and Ba are added into the insulating film 30, the co-sputtering method may be also used.

Figure 10A:
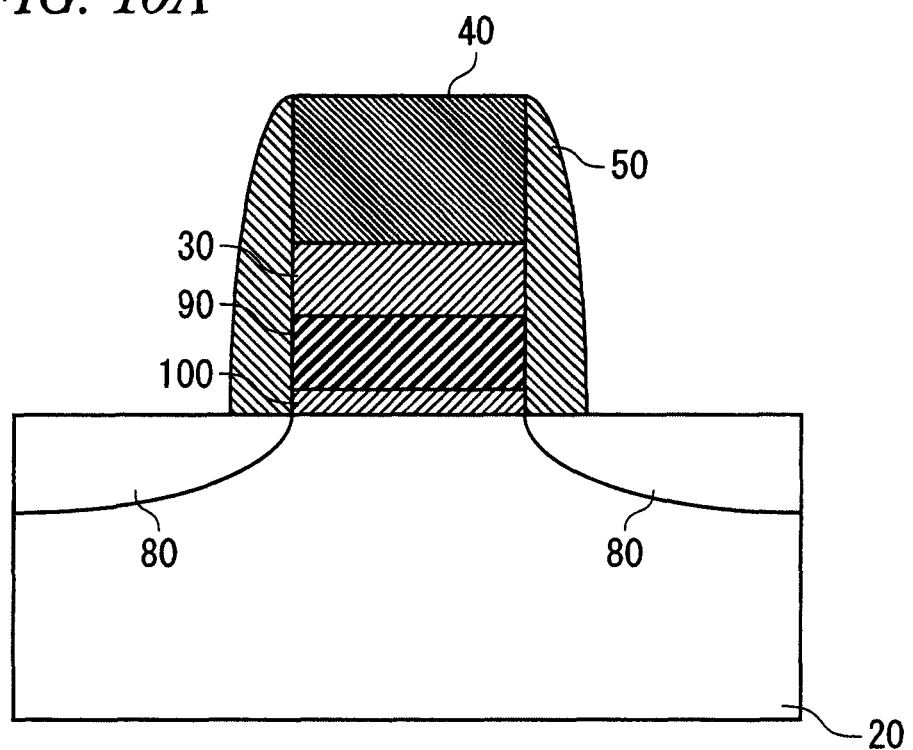
FIG. 10A is an exemplary diagram showing a process for manufacturing a non-volatile semiconductor device according to the first embodiment.

As shown in FIG. 10A, the insulating film 30 may be used as the whole or a part of an insulating film between a floating gate 90 and a control gate in a floating gate type nonvolatile semiconductor memory cell, for which a higher permittivity is requested.

Figure 10B:
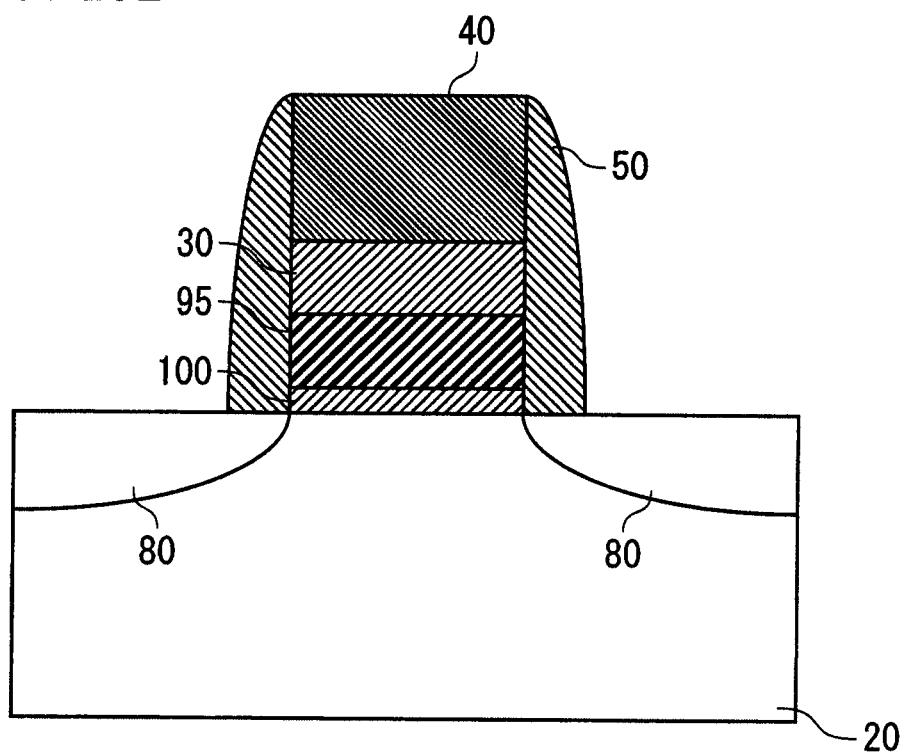
FIG. 10B is an exemplary diagram showing a process for manufacturing a non-volatile semiconductor device according to the first embodiment.

Also, as shown in FIG. 10B, a charge trap film 95 using silicon nitride or the like with a higher permittivity than a tunnel insulating film 100 may be introduced into the insulating film 30 to form the semiconductor device as a MONOS (Metal Oxide Nitride Oxide Semiconductor) structure.

Figure 10C:
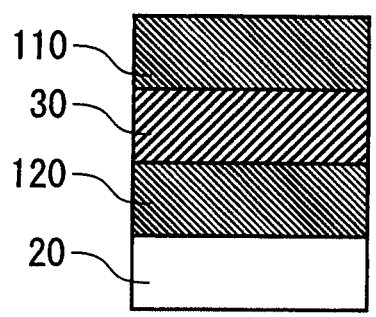
FIG. 10C is an exemplary diagram showing an MIM structure according to the first embodiment.

Also, as shown in FIG. 10C, the insulating film 30 may be used as the whole or a part of an insulating film in a metal/insulator/metal device.

Figure 10D:
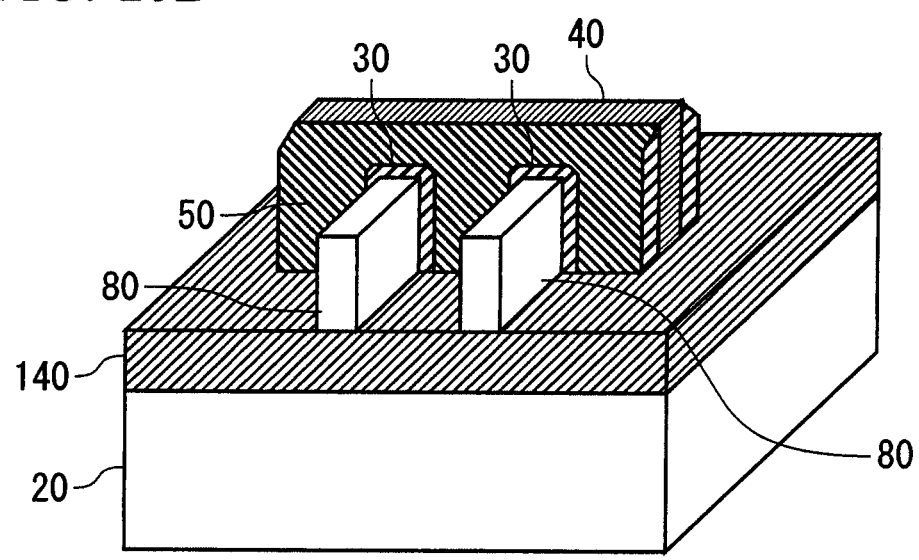
FIG. 10D is an exemplary diagram showing a Fin type semiconductor device according to the first embodiment.

Also, the semiconductor device 10 according to the first embodiment may be used as a semiconductor device with a Fin type structure as shown in FIG. 10D.

In the first embodiment, description has been made only on material configurations based on lanthanum aluminate. However, the La-site of the lanthanum aluminate may be substituted with an element selected from lanthanum series (Ln), and the Al-site thereof may be substituted with an element selected from Y and Sc. In such a case, at least one element selected from Si, Ge, Mg, Ca, Sr, Ba and N (when N is added, N enters the O-site) is added into the La-site or the O-site and at least one element selected from Ti, Zr and Hf is added into the Al-site. Thereby, the insulating film 30 can be formed. In this case, for example, the insulating film 30 chiefly contains $LaYO_3$. The reason why the lanthanum series elements may be used in the La-site of the lanthanum aluminate and the elements Y and Sc may be used in the Al-site thereof is because the perovskite type structure can be kept even if the sites are substituted with these elements.

When the insulating film 30 according to the first embodiment is used, it is possible to provide a semiconductor device having both of a high carrier mobility and a low power consumption, and a method for manufacturing the same.

Example 1

The characteristics of the insulating film 30 composing the semiconductor device 10 described in the first embodiment were evaluated in terms of AES (Auger Electron Spectroscopy), TEM (Transmission Electron Microscope) image observation, C-V characteristic, leakage current versus gate voltage characteristic, temperature dependency of the C-V characteristic, and XPS.

First, the result of AES measurement will be shown.

Figure 11A:
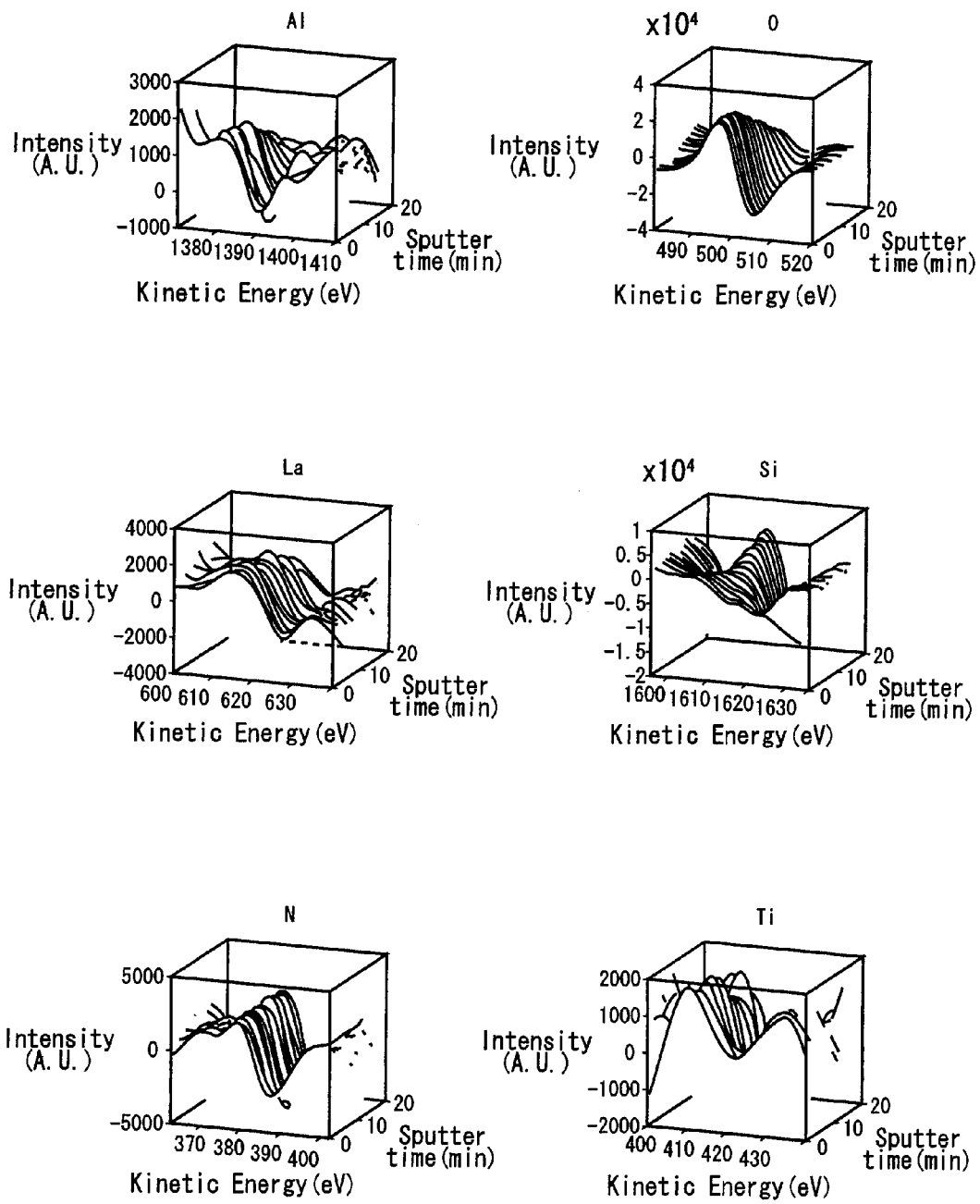
FIG. 11A is an exemplary diagram showing a result of AES in the case where Si and N were added to an insulating film.

FIG. 11A is a chart showing a result in which an insulating film containing N and Ti in $LaAlO_3$ on a semiconductor substrate of Si was etched by a sputtering method and evaluated sequentially by AES.

After a natural oxide film formed on the surface of the semiconductor substrate of Si was eliminated using a diluted hydrogen fluoride solution, an insulating film of $LaAlO_3$ was formed on the semiconductor substrate, and a gate electrode of TiN was formed on the insulating film. In a nitrogen atmosphere, heat treatment at 1,040° C. was performed thereon, and the gate electrode was separated by wet etching. Thereby, this insulating film was formed.

The front side on the paper of FIG. 11A indicates the opposite surface of the insulating film to the semiconductor substrate, and the rear side on the paper of FIG. 11A indicates the semiconductor substrate side. Also, the three axes in FIG. 11A designate intensity, energy (eV) and sputter time (min).

In the result shown in FIG. 11A, peaks of La, Al, Si, N, Ti and O can be confirmed. It can be therefore seen that the insulating film was formed by coexistence of La, Al, Si, N, Ti and O.

Figure 11B:
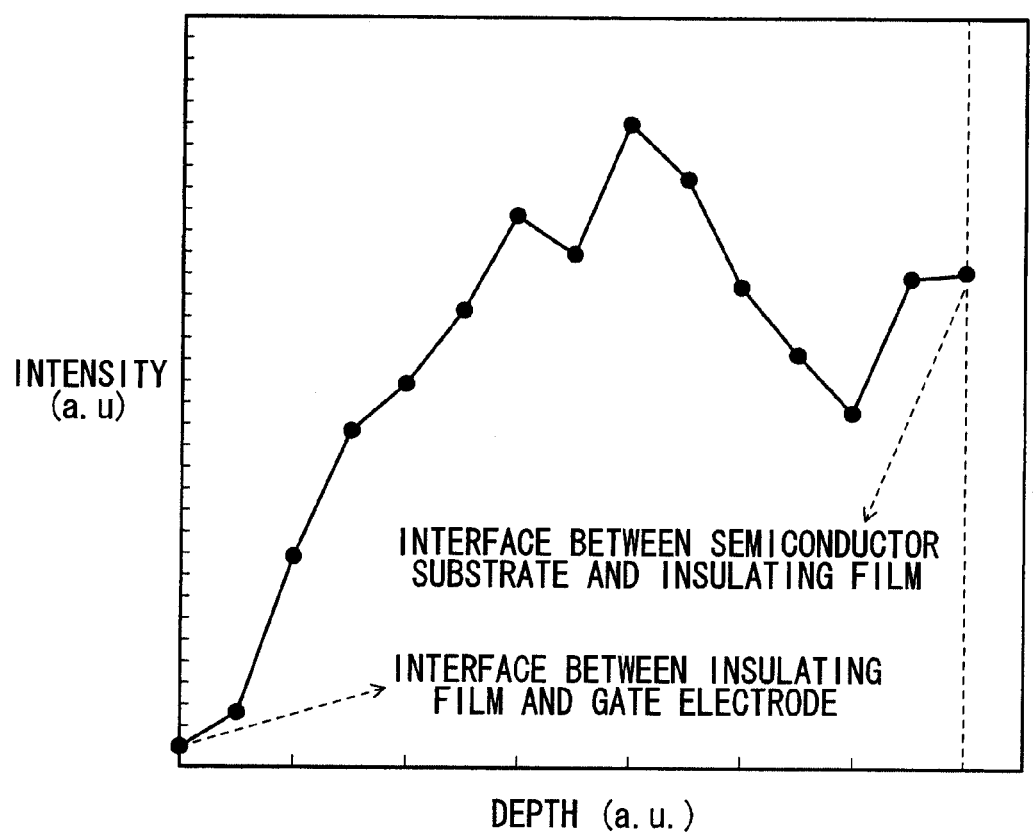
FIG. 11B is an exemplary diagram showing a result of AES in the case where N was added to an insulating film.

FIG. 11B is a chart showing the concentration distribution of N in the insulating film. The ordinate designates an intensity in the AES measurement (normalized by a maximum value). The abscissa designates a depth from an interface between the gate electrode and the insulating film toward an interface between the insulating film and the semiconductor substrate. From FIG. 11B, it can be seen that the peak of N profile was near the interface between the semiconductor substrate and the insulating film, that is, on the semiconductor substrate side.

Also, from the result of the AES measurement, it can be seen that the concentration distribution of N having plural local maximum values in the film thickness direction of the insulating film 30 was generated, and that the plural local maximum values were equal to or higher than 5 at % and equal to or lower than 25 at %. It also can be seen that the concentration distributions of Si and Ti having plural local maximum values in the film thickness direction of the insulating film 30 were also generated, and that the plural local maximum values were equal to or higher than 5 at % and equal to or less than the concentration of Al. The reason why the local maximum values were equal to or lower than the concentration of Al is because the perovskite structure of $LaAlO_3$ had to be kept.

It has been known that if the concentration of N exceeds 25 at %, the carrier mobility is lowered due to scattering factors other than oxygen defects. It is, therefore, preferable that the concentration of N is equal to or lower than 25 at %.

In this manner, the existence of N on the semiconductor substrate side can suppress the diffusion of La and Al on the semiconductor substrate side. Therefore, the addition of N can prevent deterioration of the interface between the insulating film and the semiconductor substrate.

Figure 12:
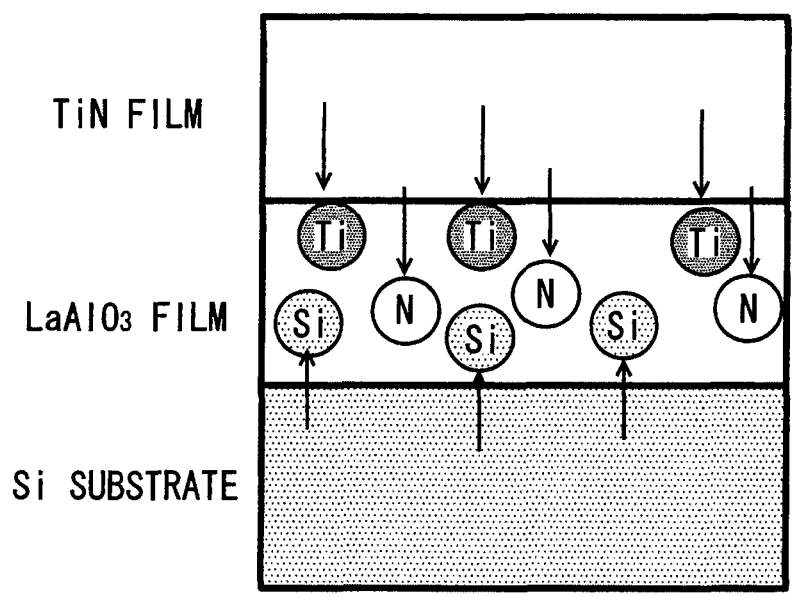
FIG. 12 is an exemplary diagram for explaining how Ti and N are introduced into an insulating film.

The result of the AES measurement can be schematized as shown in FIG. 12.

FIG. 12 is a view showing a state where Si, Ti and N are introduced into an insulating film which is formed on a semiconductor substrate and on which a gate electrode is formed. As shown in FIG. 12, it can be considered that, due to heat treatment performed on the structure of the $TiN/LaAlO_3/Si$ substrate at 1,040° C. in a nitrogen atmosphere, Ti and N from TiN and Si from the Si substrate side are respectively introduced into the insulating film to form an insulating film of LaAlTiSiON. Incidentally, the symbol '/' designates stack, showing that a substance on the left side of the symbol '/' is formed on a substance on the right side thereof.

Next, the result of an image observed by TEM will be shown.

Figure 13A:
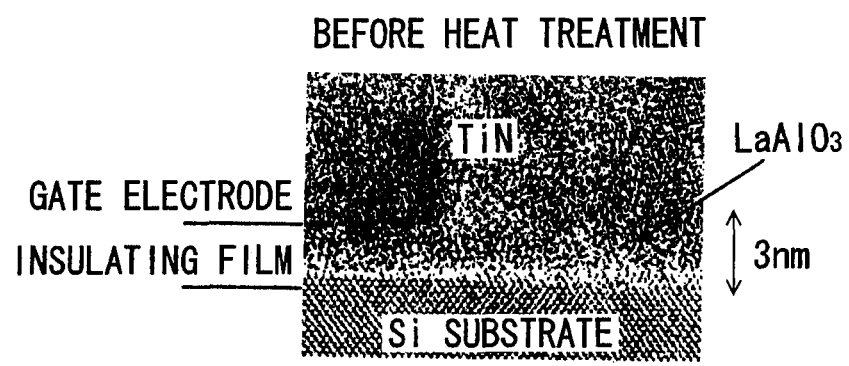
FIG. 13A is an exemplary TEM image of an insulating film before a heat treatment.
Figure 13B:
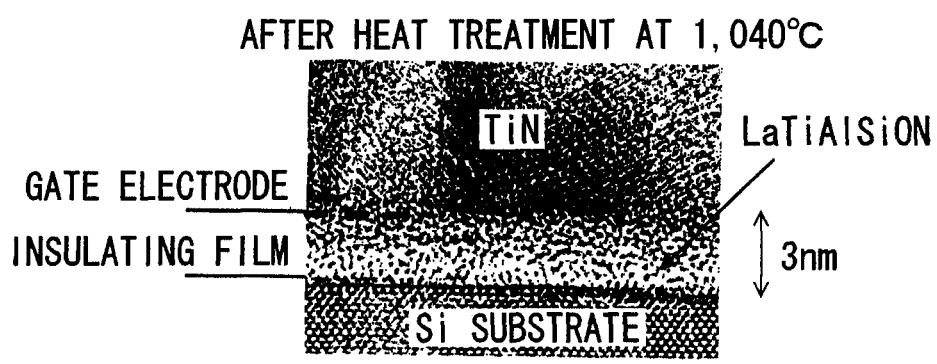
FIG. 13B is an exemplary TEM image of the insulating film after the heat treatment.

FIGS. 13A and 13B are views showing results of sectional TEM observations, in which an insulating film containing N and Ti as well as $LaAlO_3$ was formed on a semiconductor substrate of Si.

FIG. 13A shows a view in which heat treatment was not performed, and FIG. 13B shows a view in which heat treatment at 1,040° C. was performed.

As shown in FIGS. 13A and 13B, it can be seen that the insulating film kept its amorphous state uniformly even after the process of the heat treatment at a high temperature of 1,040° C. From this fact, it can be seen that N is supplied into LaAlO$_3$ from TiN effectively. Thus, the addition of N into LaAlO$_3$ can suppress crystallization of the insulating film. When the crystallization of the insulating film is suppressed, it is possible to suppress variation in characteristic, increase in leakage current and decrease in carrier mobility.

Next, the result of the C-V curve characteristic will be shown.

Figure 14:
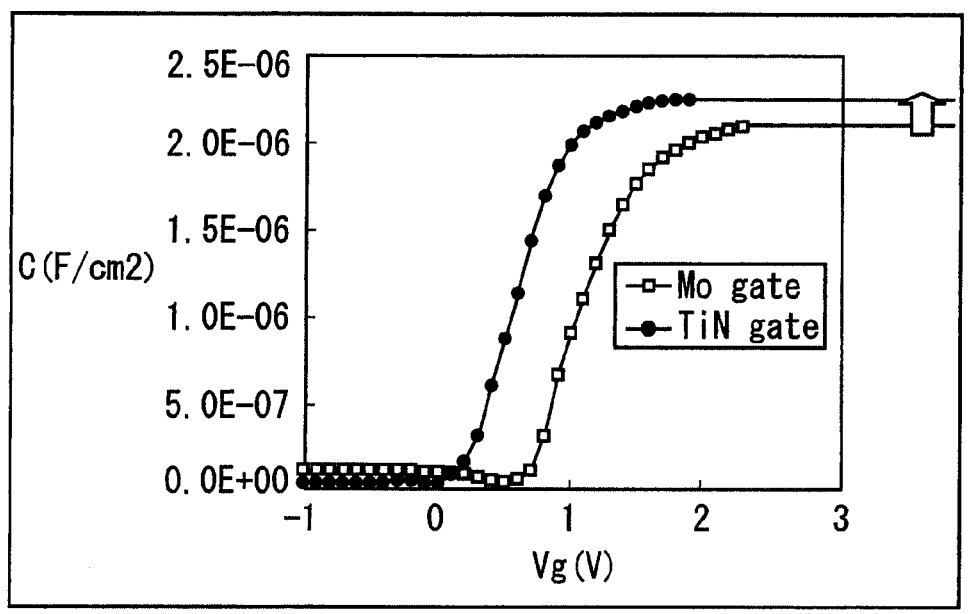
FIG. 14 is an exemplary diagram showing a result of a C-V curve characteristic of an insulating film.

FIG. 14 is a chart showing the result of the C-V curve characteristic of an MIS (Metal Insulator Semiconductor) capacitor in which an insulating film containing N and Ti as well as LaAlO$_3$ was formed on a semiconductor substrate of Si and a gate electrode of TiN was formed further thereon, and the result of the C-V curve characteristic of an MIS capacitor in which an insulating film of LaAlO$_3$ was formed on a semiconductor substrate consisting of Si and a gate electrode of Mo was formed further thereon. It is noted that heat treatment at 1,040° C. was performed on the insulating films.

In FIG. 14, the abscissa designates voltage Vg (V), and the ordinate designates capacitance C (F/cm$^2$).

It can be seen that the capacitance value in the case where TiN was used for the gate electrode was higher than that in the case where Mo was used for the gate electrode. It can be considered that this reason is because only Si was introduced into the insulating film to lower the permittivity thereof when Mo was used for the gate electrode, whereas a high permittivity could be obtained due to the existence of Si, Ti and N in the insulating film when TiN was used for the gate electrode. Thus, when TiN is used for a gate electrode, a drive current as a transistor can be increased to increase the performance.

Next, the result of the leakage current versus gate voltage characteristic will be shown.

Figure 15A:
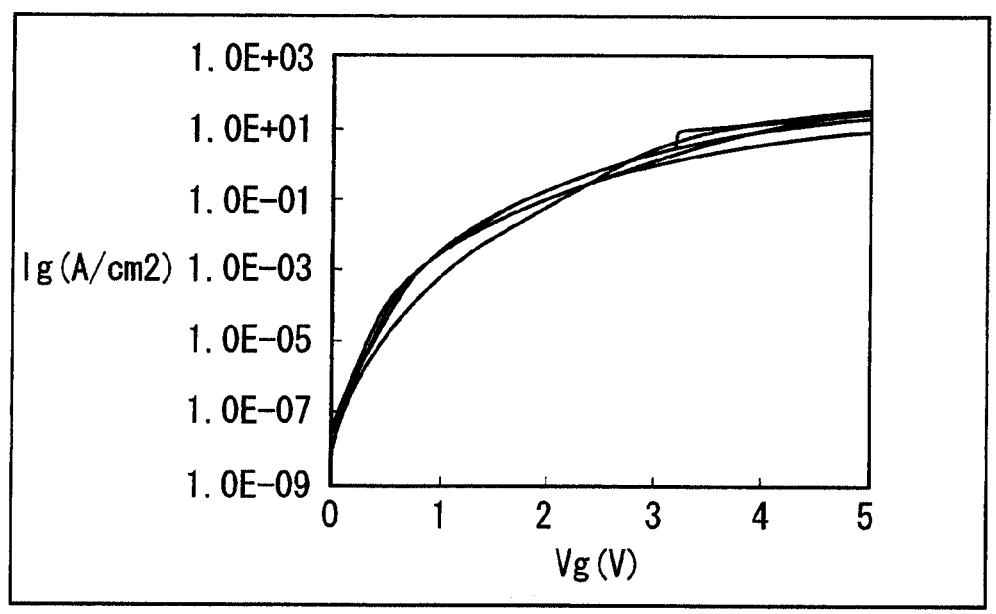
FIG. 15A is an exemplary diagram showing a leakage current versus gate voltage characteristic of an insulating film.

FIG. 15A is a chart showing the result of the leakage current versus gate voltage characteristic of an MIS capacitor in which an insulating film containing N and Ti as well as LaAlO$_3$ was formed on a semiconductor substrate of Si and a gate electrode of TiN was formed further thereon. FIG. 15A shows the result of evaluation on five devices. Also, heat treatment at 1,040° C. was performed on the insulating film.

Figure 15B:
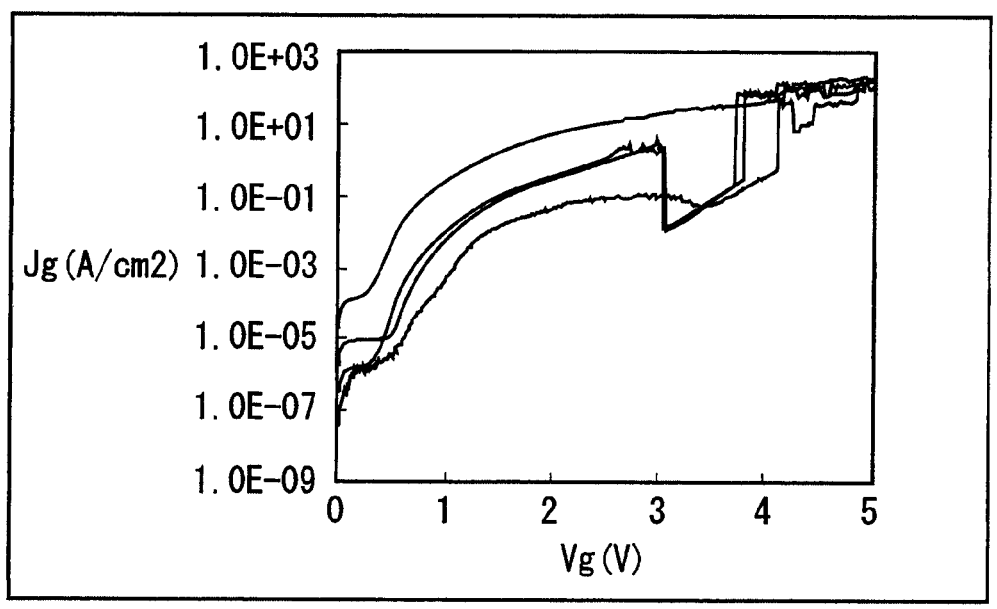
FIG. 15B is an exemplary diagram showing a leakage current versus gate voltage characteristic of an insulating film.

FIG. 15B is a chart showing the result of the leakage current versus gate voltage characteristic of an MIS capacitor in which an insulating film of LaAlO$_3$ was formed on a semiconductor substrate of Si and a gate electrode of Mo was formed further thereon. FIG. 15B shows the result of evaluation on four devices.

When TiN was used for the gate electrode, there was little variation in the leakage current versus gate voltage characteristic as shown in FIG. 15A.

On the other hand, when Mo was used for the gate electrode, there occurred a variation in the leakage current versus gate voltage characteristic as shown in FIG. 15B.

Thus, it can be considered that the reason why the variation in the leakage current versus gate voltage characteristic could be suppressed when TiN was used for the gate electrode is because crystallization could be suppressed due to the addition of N into LaAlO$_3$ from TiN.

Next, the heat treatment temperature dependency of the C-V characteristic will be shown.

Figure 16:
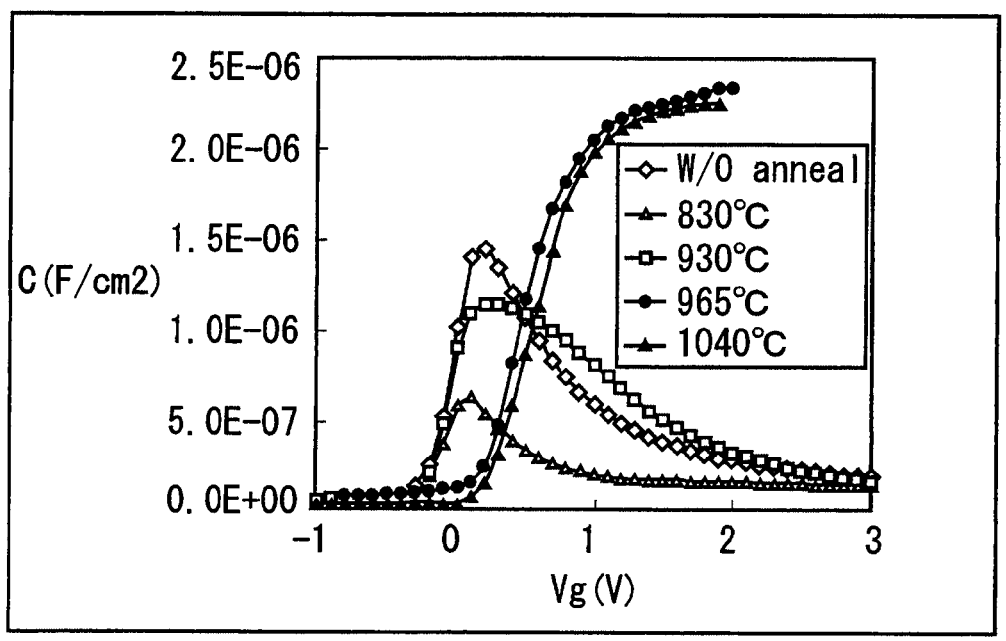
FIG. 16 is an exemplary diagram showing a result of a temperature dependency of a C-V characteristic of an insulating film.

FIG. 16 is a chart showing the result of the C-V characteristic of MIS capacitors on which heat treatment was performed in a nitrogen atmosphere at 830° C., 930° C., 965° C. and 1,040° C., respectively. Each of the MIS capacitors was constituted by an insulating film and a gate electrode. The insulating film of LaAlO$_3$ was formed on a semiconductor substrate consisting of Si. The gate electrode of TiN was formed on the insulating film. It is noted that "w/o anneal" in FIG. 16 designates the C-V characteristic of an MIS capacitor on which heat treatment was not performed. The abscissa designates voltage Vg (V), and the ordinate designates capacitance C (F/cm$^2$).

As shown in FIG. 16, before the heat treatment or after the heat treatment at a temperature not higher than 930° C., the capacitance value showed a local maximum value at about 0 V. The capacitance value decreased as the voltage increased from 0 V. Thus, a capacitance saturation characteristic which was expected as an MIS capacitor was not observed. From this fact, it can be seen that a good function as a semiconductor device cannot be obtained by the heat treatment at a temperature not higher than 930° C.

On the other hand, when the heat treatment at 965° C. or 1,040° C. was performed, the capacitance value increased with the increase of the voltage, and the saturation characteristic was observed. It can be seen that a good characteristic can be obtained thus.

This means that Ti, N and Si with adequate concentrations cannot be introduced into LaAlO$_3$ without using a high temperature which is equal to higher than 965° C. and which is high enough to activate impurities, and that as a result, the structure which cannot obtain a good electric characteristic is formed. Also, the upper limit of the heat treatment temperature depends on the melting point of Si, that is, is 1,410° C.

Next, it was studied what structural difference caused a difference in C-V characteristic between the heat treatment performed at 930° C. and the heat treatment performed at a temperature not lower than 965° C., using a back-side XPS analysis method. Heat treatment at 1,040° C. was performed as an example of a temperature not lower than 965° C. The reason why the XPS evaluation was performed on the back side is because the existence of a thick TiN electrode prevents detection of a signal from an insulating film in the case of the XPS evaluation on the gate electrode side. Therefore, an insulating film was evaluated on the back side of a semiconductor substrate which had been mechanically polished and then etched.

Figure 17:
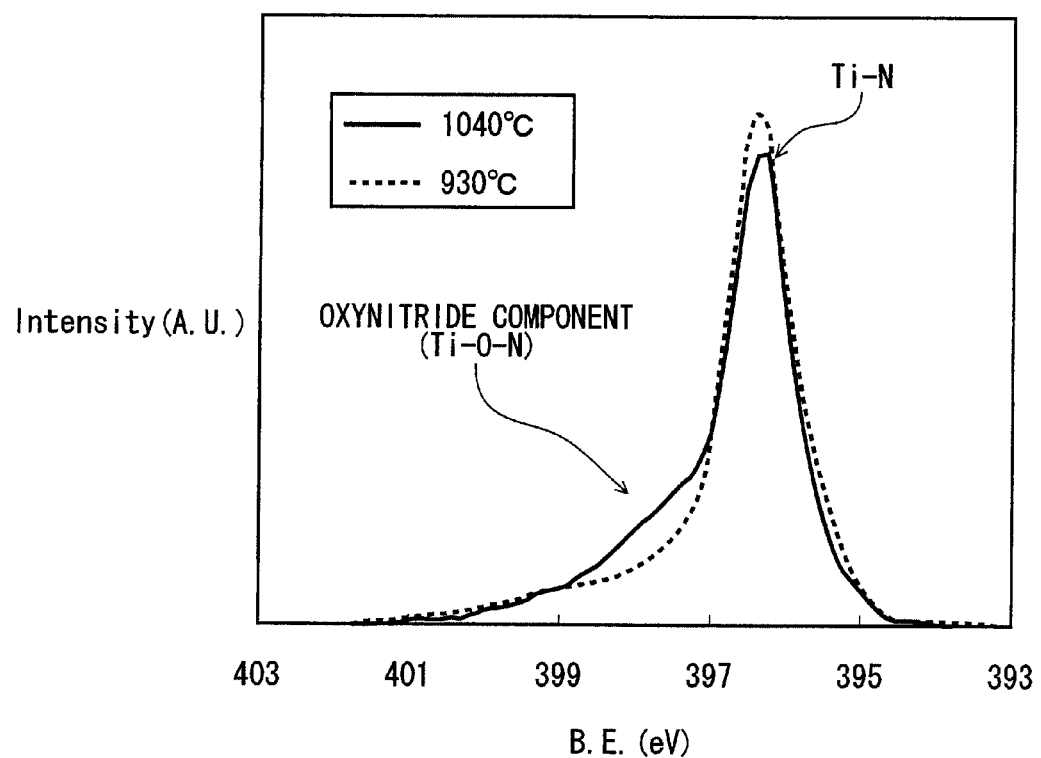
FIG. 17 is an exemplary diagram showing a result of a temperature dependency of XPS of an insulating film.

FIG. 17 is a chart showing the results of the back-side XPS analysis on semiconductor devices on which heat treatment was performed in a nitrogen atmosphere at 930° C. and 1,040° C., respectively. Each semiconductor device was constituted by an insulating film and a gate electrode. The insulating film of LaAlO$_3$ was formed on a semiconductor substrate of Si. The gate electrode of TiN was formed on the insulating film. The abscissa designates energy (eV), and the ordinate designates intensity.

Also, measurement was performed based on an XPS signal detected in a normal direction of the surface of each semiconductor substrate, and FIG. 17 shows 1 s spectra of N. The two spectra were normalized by their spectral areas.

As shown in FIG. 17, a peak attributed to an oxynitride component (Ti—O—N) as well as a peak attributed to N in TiN of the gate electrode was observed from the sample on which heat treatment at 1,040° C. had been performed.

From this fact, it can be seen that N had been added into LaAlO$_3$ from TiN composing the gate electrode in the heat treatment at 1,040° C.

Next, the result of the back-side XPS measurement performed at a detection angle of 75° with respect to the normal direction of the semiconductor substrate surface to obtain information about the interface between the semiconductor substrate and the insulating film will be shown.

Figure 18:
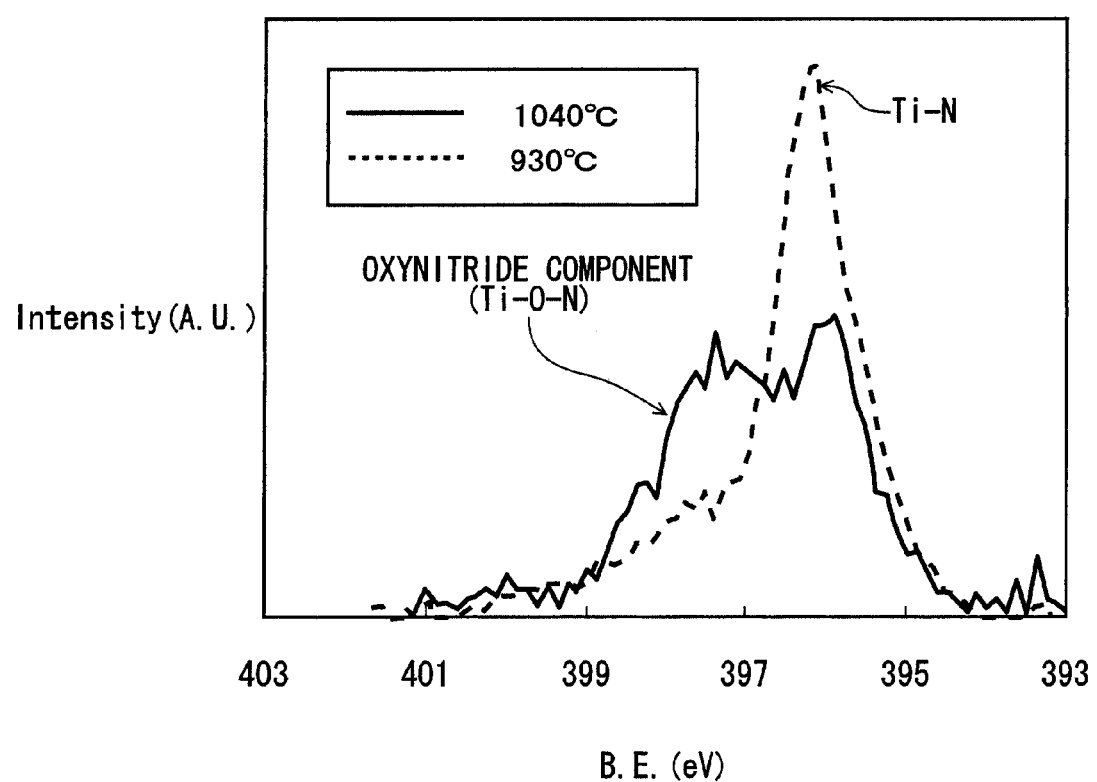
FIG. 18 is an exemplary diagram showing a result of a temperature dependency of XPS of an insulating film.

FIG. 18 is a chart showing the result of the back-side XPS analysis. The back-side XPS analysis in FIG. 18 is different from the back-side XPS analysis described with reference to FIG. 17 in that measurement was performed at an angle of 75° with respect to the normal direction of the semiconductor substrate surface. When measurement is made on that condition, the interface with the semiconductor substrate can be measured more sensitively. The abscissa designates energy (eV), and the ordinate designates intensity.

In comparison between FIG. 17 and FIG. 18, it can be seen that the peak of an oxynitride component (Ti—O—N) increased at a heat treatment temperature of 1,040° C. In addition, in FIG. 18, the bond peak of Ti—N decreased as compared with that in FIG. 17. From this fact, it can be considered that N in the Ti—N bond contributed to N in the oxynitride component. That is, it can be seen that the N concentration was high near the interface between the semiconductor substrate and the insulating film.

Next, an insulating film of $LaAlO_3$ was formed on a semiconductor substrate of Si, and a gate electrode of TiN was formed on the insulating film. As (arsenic) was ion-injected into the semiconductor substrate to form source-drain regions in the semiconductor substrate. Finally, heat treatment was performed thereon at 1,040° C. to electrically activate As ion-injected into the semiconductor substrate. Thus, an N-MISFET was manufactured.

Example 2

As shown in FIG. 10A, a tunnel insulating film 100 of $SiO_2$, a floating gate of polysilicon, an insulating film 30 containing $LaAlO_3$, and a gate electrode 40 of polysilicon were formed sequentially on a semiconductor substrate 20 of Si. Thus, a high-performance capacitor was manufactured.

When nothing was added to $LaAlO_3$, the silicon of the gate electrode of polysilicon was diffused into the insulating film. Thus, the insulating film was a film having a low permittivity (relative permittivity≈10).

On the other hand, $LaAlO_3$ to which Ti and N were added was produced by a co-sputtering method using two targets of $LaAlO_3$ and TiN, and the insulating film was densified by heat treatment at a high temperature (1,050° C.). In this case, diffusion of silicon into the insulating film from the gate electrode of polysilicon was suppressed adequately so that a high permittivity could be obtained by the effect of the introduced N. The relative permittivity as a high-performance capacitor in this case was about 30. In addition, although it can be considered that there occurred some diffusion of silicon into the insulating film from the gate electrode, it can be considered that Ti, N and Si were diffused in the insulating film due to the high temperature treatment at 1,050° C. and that the relationship of [Ti]=[N]+[Si] was established.

Example 3

As shown in FIG. 10C, an insulating film 30 containing $LaAlO_3$ and an electrode layer 110 of TiN were formed onto a semiconductor substrate 20 of Si with an electrode layer 120 of TiAlN buffer being disposed therebetween, and heat treatment was performed thereon at 1,050° C. Thereby, an MIM capacitor was manufactured.

Also, as described in Example 2, it can be considered that Ti, N and Si were diffused in the insulating film due to the high temperature treatment at 1,050° C., and the relationship of [Ti]=[N]+[Si] was established.

Example 4

As shown in FIG. 10B, a tunnel insulating film 100 of $SiO_2$, a charge accumulating film 95 of silicon nitride being silicon-rich, an insulating film 30 containing $LaAlO_3$, and a gate electrode 40 of TiN were formed sequentially on a semiconductor substrate 20 of Si. Thereby, a memory cell was manufactured.

"Silicon-rich" means a state where the content of Si is higher than the content of Si in the composition of $Si_3N_4$ (containing 75% Si relative to N) but not higher than the content of Si in the composition of $Si_{19}N_{20}$ (containing 95% Si relative to N). Also, the silicon nitride film serves as a charge trap film. It is noted that the insulating film serves as a block insulating film.

Further, $SiO_2$ was formed as gate side walls on the side walls of the silicon nitride film, the insulating film containing $LaAlO_3$ and the electrode of TiN. However, $SiO_2$ of the gate side walls was diffused into the insulating film during heat treatment performed for forming $SiO_2$. Thus, the permittivity of the insulating film was lowered (relative permittivity≈12).

Therefore, a side wall insulating film of $SiO_2$ was formed in a state where Ti and N had been added into the insulating film containing $LaAlO_3$, and verification was performed thereon. Here, an insulating film containing $LaAlO_3$ and added with Ti and N by a co-sputtering method using two targets of $LaAlO_3$ and TiN was formed, and heat treatment at a high temperature (1,050° C.) was performed thereon to densify the insulating film. It can be seen that little silicon in the gate side walls was diffused into the insulating film of $LaAlO_3$ added with Ti and N, but a leakage current was low, and further the insulating film could be formed with a high permittivity. Also here, it can be considered that in the insulating film containing $LaAlO_3$ added with Ti and N and serving as a block film, Ti, N and Si were diffused due to the high temperature treatment at 1,050° C. to establish the relationship of [Ti]=[N]+[Si] in the insulating film.

As described above, Examples 1 to 4 show that due to Ti, Si and N added into an insulating film containing $LaAlO_3$, the characteristic of the insulating film can be improved so that it is possible to provide an insulating film which is high in permittivity, few in oxygen defect and small in leakage current.

It is, however, possible to obtain an insulating film having a similar configuration even if an insulating film to be the base includes $ABO_3$ (e.g. $LaYO_3$) in which an element selected from lanthanum series material Ln including La forms an A-site and an element selected from Al, Y and Sc forms a B-site. At this time, assuming that the total amount of each additive M in another combination than the combination of Ti, Al and N is expressed as [M], it can be considered that the characteristic can be improved in the same manner if at least one from the left-hand side of a relation of [Si]+[Ge]+[Mg]+[Ca]+[Sr]+[Ba]+[N]=[Ti]+[Zr]+[Hf] and at least one from the right-hand side of the relation are added so as to establish the relation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
a semiconductor substrate;
a source region formed in the semiconductor substrate, a drain region formed in the semiconductor substrate and being separate from the source region;

an insulating film formed between the source region and the drain region and on or above the semiconductor substrate, the insulating film including lanthanum aluminate containing at least one element selected from Si, Ge, Mg, Ca, Sr, Ba and N and the lanthanum aluminate containing at least one element selected from Ti, Hf and Zr; and a gate electrode formed on the insulating film, wherein the N is contained in the insulating film, and a concentration distribution of the N in the insulating film has a peak at a position which is closer to an interface of the insulating film on a semiconductor substrate side than that of the insulating film on a gate electrode side.

2. The semiconductor device according to claim 1, further comprising:

an oxide layer between the semiconductor substrate and the insulating film.

3. The semiconductor device according to claim 1, wherein the semiconductor substrate is one of a Si substrate, a Ge substrate, and a SiGe substrate, and the gate electrode includes metal nitride containing at least one element selected from Ti, Hf and Zr.

4. The semiconductor device according to claim 1, wherein the insulating film is amorphous.

5. A semiconductor device comprising:

a semiconductor substrate;

a source region formed in the semiconductor substrate, a drain region formed in the semiconductor substrate and being separate from the source region;

an insulating film formed between the source region and the drain region and on or above the semiconductor substrate, the insulating film including lanthanum aluminate containing at least one element selected from Si, Ge, Mg, Ca, Sr, Ba and N and the lanthanum aluminate containing at least one element selected from Ti, Hf and Zr; and a gate electrode formed on the insulating film, wherein the insulating film includes the N, a maximum value of a concentration of the N in the insulating film is equal to or higher than 5 at % and equal to or lower than 25 at %, the insulating film further includes at least another one element selected from Si, Ge, Mg, Ca, Sr and Ba, and a local maximum value of a concentration of each of the at least another one element in the insulating film is equal to or higher than 5 at % and is equal to or less than a concentration of La in the insulating film.

6. The semiconductor device according to claim 5, further comprising:

an oxide layer between the semiconductor substrate and the insulating film.

7. The semiconductor device according to claim 5, wherein the semiconductor substrate is one of a Si substrate, a Ge substrate, and a SiGe substrate, and the gate electrode includes metal nitride containing at least one element selected from Ti, Hf and Zr.

8. The semiconductor device according to claim 5, wherein the insulating film is amorphous.

9. A semiconductor device comprising:

a semiconductor substrate;

a source region formed in the semiconductor substrate, a drain region formed in the semiconductor substrate and being separate from the source region;

an insulating film formed between the source region and the drain region and on or above the semiconductor substrate, the insulating film including lanthanum aluminate containing at least one element selected from Si, Ge, Mg, Ca, Sr, Ba and N and the lanthanum aluminate containing at least one element selected from Ti, Hf and Zr; and a gate electrode formed on the insulating film, wherein a local maximum value of a concentration of each of the at least one element selected from Ti, Zr and Hf in the insulating film is equal to or higher than 5 at % and is equal to or lower than a concentration of Al in the insulating film.

10. The semiconductor device according to claim 9, further comprising:

an oxide layer between the semiconductor substrate and the insulating film.

11. The semiconductor device according to claim 9, wherein the semiconductor substrate is one of a Si substrate, a Ge substrate, and a SiGe substrate, and the gate electrode includes metal nitride containing at least one element selected from Ti, Hf and Zr.

12. The semiconductor device according to claim 9, wherein the insulating film is amorphous.

* * * * *